United States Patent [19]

Ohishi et al.

[11] Patent Number: 4,841,536
[45] Date of Patent: Jun. 20, 1989

[54] SEMICONDUCTOR LASER DEVICES

[75] Inventors: Akio Ohishi, Kokubunji; Motohisa Hirao, Tokyo; Naoki Chinone; Shinji Tsuji, both of Hachioji; Hitoshi Nakamura, Kanagawa; Hiroyoshi Matsumura, Saitama, all of Japan

[73] Assignee: Hitachi, Ltd., Tokyo, Japan

[21] Appl. No.: 850,685

[22] Filed: Apr. 11, 1986

[30] Foreign Application Priority Data

Apr. 12, 1985 [JP] Japan .................................. 60-76745
Sep. 11, 1985 [JP] Japan ................................. 60-199416
Feb. 28, 1986 [JP] Japan .................................. 61-41773

[51] Int. Cl.$^4$ .............................................. H01S 3/19
[52] U.S. Cl. ..................................................... 372/46
[58] Field of Search ............................ 372/46, 45, 44

[56] References Cited

U.S. PATENT DOCUMENTS 4,542,511 9/1985 Goodfellow et al. ................ 372/46

Primary Examiner—James W. Davis
Attorney, Agent, or Firm—Antonelli, Terry & Wands

[57] ABSTRACT

This invention discloses a semiconductor laser capable of a high temperature and high output operation by forming a mesa stripe having an active layer in a reverse triangular mesa shape and forming thick semiconductor layers on both sides of the mesa stripe in such a manner that the resulting p-n junctions have a current blocking function. The invention discloses also a semiconductor laser wherein the formation of the p-n junctions described above is made before the formation of the reverse mesa stripe, and ion implantation is introduced in order to form the p-n junctions. Furthermore, the invention relates to transistors and semiconductor lasers using InGaAsP type quaternary compounds as the semiconductor. The quaternary compounds having a composition in which an energy band gap is from 1.2 to 1.4 eV are formed in a thickness of up to 1 $\mu$m, and there can be thus obtained semiconductor devices having a small leakage current and being stable with time.

6 Claims, 5 Drawing Sheets

SEMICONDUCTOR LASER DEVICES

BACKGROUND OF THE INVENTION

This invention relates generally to semiconductor devices and more particularly to the structure of buried hetero structure semiconductor lasers and semiconductor devices utilizing fully the characteristics of the junction using an InGaAsP quaternary compound semiconductor. Further particularly the present invention relates to the semiconductor laser devices described above which use the semiconductor devices of the InGaAsP quarternary compound semiconductor, to transistors having an excellent current amplification ratio and an excellent current blocking ratio and to the semiconductor lasers of the type described above having a small threshold current value but having high reliability.

Among conventional buried hertero structure semiconductor lasers, there is a structure in which the thickness of a semiconductor layer on an active layer is first increased sufficiently ($\gtrsim 3$ μm), reverse triangular shaped mesa stripe is then formed and thereafter current block layers are selectively grown only on both sides of the mesa while leaving the mask for the stripe such as a silicon dioxide film on the surface of the mesa stripe. In accordance with this structure, since mesa etching is deep, the position and width of the active layer has been difficult to control. Though this problem can be solved by reducing the thickness of the semiconductor layer on the active layer, an electrode formed on the mesa surface and the active layer will be too near to each other if the thickness is reduced while the structure described above is used as such. In this case, the electrode metal will be alloyed and hence the problem of reliability will develop.

On the other hand, there is also known a structure in which current blocking layers due to p-n junction are first formed on both sides of the mesa and the entire portion including the mesa is then buried. This structure is shown in FIG. 2. In this sturcture, the greater the thickness of the current blocking layer, the higher becomes the breakdown voltage so that a high temperature high output operation becomes possible. However, it has been difficult to secure a sufficient thickness (e.g. at least 1 μm) for the current blocking layer in the proximity of the mesa because the mesa is a forward mesa whose surface is smaller than that of the width and the semiconductor layer on the active layer is below 0.5 μm. This is because a selective growing method is employed for the selective growth, and hence the growth will o-cur at those portions at which the growth is not desired, if the thickness of the current blocking layer is increased.

Long wavelength semiconductor layers oscillating in a 1 μm band are known as semiconductor devices using an InGaAs layer. In other words, this is an example of the application of the long wavelength semiconductor laser to the buried layer, and the buried layer has a function as the current blocking layer. Moreover, control of a lateral mode becomes easy by use of InGaAs. However, no examination has been made on the junction using the InGaAsP layer.

SUMMARY OF THE INVENTION

It is an object of the present invention to provide a buried hetero structure semiconductor laser capable of a high temperature high output operation by increasing sufficiently the film thickness of a current blocking layer and making it possible to control the width of an active layer.

It is another object of the present invention to control the current amplification ratio and current blocking performance of semiconductor transistors utilizing an n-p-n or p-n-p structure by the junction using an InGaAsP layer, and to secure sufficient reliability.

In a buried hetero structure semiconductor laser wherein a mesa stripe having an active layer whose angle to the substrate is below 90° is formed in a reverse triangular mesa shape on a multi-layered semiconductor wafer formed on a semiconductor substrate and containing at least an active layer, the present invention disposes at least one p-n junction on both sides of the reverse mesa stripe and disposes at least one p-n junction interface between the narrowest part of the reverse mesa stripe and the upper end in order to control easily the position and width of the active layer at the time of mesa etching.

In order to solve the problems described above, the present invention forms a p-type or n-type layer, which serves as a current blocking layer, by diffusion or ion implantation before the formation of the mesa shape. Thus, the present invention provides a laser structure including a current blocking layer having an increased thickness and a method of producing such a laser structure. Since the current blocking layer is made thicker, the breakdown voltage of the current blocking layer becomes higher and a high temperature high output operation becomes possible.

In a buried hetero structure semiconductor laser of the type which is buried in such a manner as to cover a mesa stripe having an active layer whose angle with respect to a substrate is below 90° in a multi-layered semiconductor wafer which is formed on a semiconductor substrate and includes at least an active layer, the semiconductor laser in accordance with the present invention is characterized in that at least one p-n junction is disposed on both sides of the reverse mesa stripe and at least one p-n junction interface is disposed between the narrowest part of the reverse mesa stripe and the upper end. In comparison with conventional buried heterto (BH) structure semiconductor lasers, the semiconductor laser of the present invention makes it easier to control the position and width of the active layer at the time of mesa etching, and since the current blocking layer does not climb up to the upper end of the mesa as observed in conventional planar buried-hetero structures, the current blocking layer can be made uniform and a current blocking effect which is effective throughout the current blocking region can be obtained.

In accordance with the present invention, the thickness of the current blocking layer except for the current path portion can be made sufficiently thicker than in the prior art devices, so that the breakdown voltage of the current blocking layer can be increased by 30 to 60% in comparison with the prior art devices, and a high temperature and high output operation becomes possible.

In order to further improve the characteristics of the present invention by use of an InGaAsP layer, it is necessary to examine its composition and thickness. In the present invention, if the thickness of the InGaAsP layer is below 1 μm and its composition is such that the energy band gap is less than 1.2 eV, the device characteristics deteriorate drastically with the passage of time, whereas it is clarified that if a composition in which the energy band gap is from 1.2 to 1.4 eV is used, sufficient reliability can be obtained. When the InGaAsP layer of the present invention is used, a current amplification ratio of n-p-n or p-n-p transistors drops, and when the InGaAsP layer is used as a buried layer of a semiconductor laser, a leakage current flowing through the buried layer can be reduced and the laser characteristics with time can be stabilized.

In accordance with the present invention, if semiconductor layers constituting an n-p-n or p-n-p junction or a p-type or n-type layer as the intermediate layer of the multi-layer of the junction consists of the InGaAsP layer, the current amplification ratio of the junction having the transistor structure becomes small and the leakage current decreases. This is because the life of the minor carrier of the InGaAsP layer is shorter than InP. If the composition of this InGaAsP layer is such that the energy band gap is from 1.2 to 1.4 eV, the energy band gap becomes great and the composition becomes approximate to InP, so that crystallographic stability can be improved and drastic degradation can be prevented.

Incidentally, the decrease of the leakage current described above reduces a threshold current value of transistors and semiconductor lasers, and makes them easier to use.

When the InGaAsP type compound semiconductors are used in the present invention, there can be obtained semiconductor devices having high reliability such as lateral single mode semiconductor lasers having a small threshold current value with a small change of the threshold current value with the passage of time. Therefore, the present invention can improve reliability of various electronic devices and apparatuses.

DESCRIPTION OF THE PREFERRED EMBODIMENTS

Embodiment 1

Figure 1:
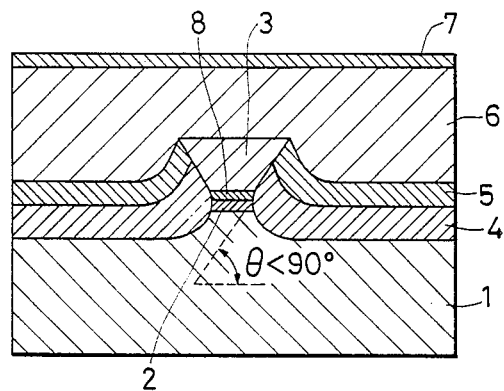
FIG. 1 is a sectional view showing a semiconductor laser in accordance with one embodiment of the present invention.

FIG. 1 is a sectional view showing a first embodiment of the present invention. An active layer 2 (thickness $d=0.1$ $\mu$m, wavelength $\lambda=1.52$ $\mu$m), a p-type buffer layer 8 ($d=0.2$ $\mu$m, $\lambda=1.27$ $\mu$m) and a p-type InP cladding layer 3 ($d=0.8\sim2.0$ $\mu$m) are sequentially grown on an n-type InP substrate 1 by liquid phase epitaxy. A stripe mask (width=5 $\mu$m) of a silicon dioxide film ($SiO_2$) is formed on the multi-layered wafer described above, and only the InP cladding layer 3 on the buffer layer 8 is selectively etched using an etching solution containing hydrocloric acid (HCl), thereby forming mesa which is from 1.8 to 3.0 $\mu$m wide. Then, the active layer 2 (including the buffer layer 8) is etched by a bromine-methyl alcohol etching solution to form a reverse mesa. At this time, if the mask for mesa etching is formed in a direction of $(0\bar{1}1)$ (including equivalent direction), a (111) plane is formed as the side surface of the mesa by use of the bromine-methyl alcohol etching solution, and a $(\theta\sim60°)$ reverse mesa shape can be obtained. In this embodiment the width of the active layer is controlled to the range of from 0.8 to 1.2 $\mu$m.

Figure 2:
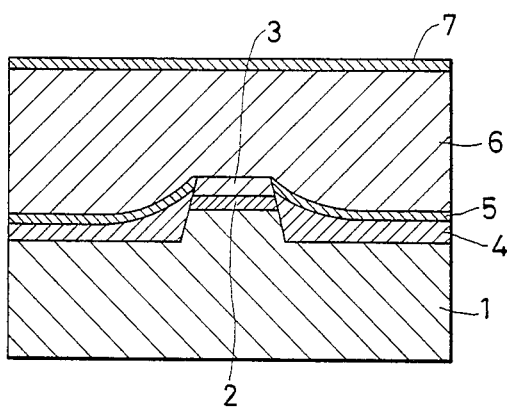
FIG. 2 is a sectional view showing conventional planar buried-hetero structure semiconductor laser.

After the mesa is thus formed, the $SiO_2$ film on the mesa surface is removed by a hydrofluoric acid type etching solution, and the current blocking layers of a p-type InP layer 4 and an n-type InP layer 5 are grown by liquid phase epitaxy. Thereafter a p-type InP layer 6 and a p-type cap layer 7 ($\lambda=1.15$ $\mu$m) are grown in succession. In this embodiment, the p-type current blocking layer 4 is from 0.4 to 0.8 $\mu$m thick, the n-type current blocking layer 5 is from 0.3 to 0.6 $\mu$m thick, the p-type InP layer 6 is from 1 to 3 $\mu$m thick and the p-type can layer 7 is from 0.2 to 0.5 $\mu$m thick. In this case, if the thickness $d_b$ of the p-type current blocking layer 4 satisfies the relation $d_b<d_c$ with the thickness $d_c$ of the p-type cladding layer 3, the p-type current blocking layer is prevented from climbing up by the reverse mesa plane, and a current blocking layer due to the p-n junction is formed at an intermediate part of the reverse mesa. When growth with a large climbing distance is to be made as shown in FIG. 2, ungrown portions, at which a layer to be grown (such as a first or second buried layer) is not locally grown, are likely to occur at positions which are from several to 20 $\mu$m distant from the mesa stripe. In contrast, in the embodiment shown in FIG. 1, the thickness of the p-type current blocking layer is above an ordinary thickness of 0.5 $\mu$m so that local ungrowth of the layer to be grown does not occur due to small climb-up growth. In addition, since the p-n junction is formed at an intermediate part of the mesa side surface, a current blocking layer having a uniform and sufficient thickness ($\gtrsim0.1$ $\mu$m) can be formed at portions other than the mesa. Incidentally, if the thickness of the cladding layer exceeds 3.0 $\mu$m, the position of the active layer is difficult to control. This embodiment minimizes the leakage current and accomplishes a high temperature operation and a high output operation.

Though the current blocking layers 4 and 5 are the INP layers in this embodiment, they may be InGaAsP layers having a larger band gap than the active layer 2. Particularly when a p-type InP layer and an n-type InGaAsP layer ($\lambda=1.0\sim1.3$ $\mu$m) are used as the p-type current blocking layer 4 and as the n-type current blocking layer 5, respectively, a sufficient current blocking effect can be obtained between the substrate 1 and the p-type current blocking layer 4 and at the same time, the mesa stripe shape can be kept successfully. When both the n-type current blocking layers 4 and 5 consist of the InP layers, both sides of the mesa surface describe acute angles and these angles are likely to be melt back. If the n-type current blocking layer 5 consists of a quaternary layer, melt-back is difficult to occur and the reverse mesa shape can be kept successfully.

In this embodiment, the hydrochloric acid type etching solution is used for selective etching of the cladding layer 3 and then the bromine-methyl alcohol type etching solution in order to realize the reverse mesa. However, the structure of this embodiment can be realized by use of the bromine-methyl alcohol type etching solution from the beginning without using the selective etching solution. When selective etching is employed, the mesa which is nearly vertical is formed to the position immediately on the active layer. Therefore, in comparison with the methods not employing selective etching, selective etching can shorten the etching time by the bromine-methyl alcohol type etching solution. As a result, the position of the active layer 2 can be controlled more exactly by the selective etching method.

In the embodiment described above, each of the buried layers 4, 5, 6, 7 is obtained by single growth. In contrast, it is also possible to make burying growth twice so as to form the current blocking layers 4 and 5 while leaving the SiO$_2$ film on the mesa surface, then to remove the SiO$_2$ film so as to grow the p-type InP layer 6 and the InGaAsP cap layer 7. This method can prevent completely the growth of the n-type blocking layer on the mesa surface. In this embodiment, the current blocking layers 4 and 5 are single layer of p and n layers (two layers in total), but the same effect can be obtained when they consist of three or more layers.

The present invention is effective not only when the n-type substrate is used but also when the p-type substrate is used, and the structure and the production method may be the same. Though this embodiment illustrates the case where the active layer has a composition suitable for a 1.5 μm band wavelength, the present invention is effective for other wavelength bands if the composition of the active layer is a quaternary layer (InGaAsP). Though the embodiment represents the semiconductor laser having a Fabry-Perot type resonator with both cleaved facets, the structure and production method of the present invention can be applied similarly to distributed feedback (DFB) semiconductor lasers.

Embodiment 2

Figure 3:
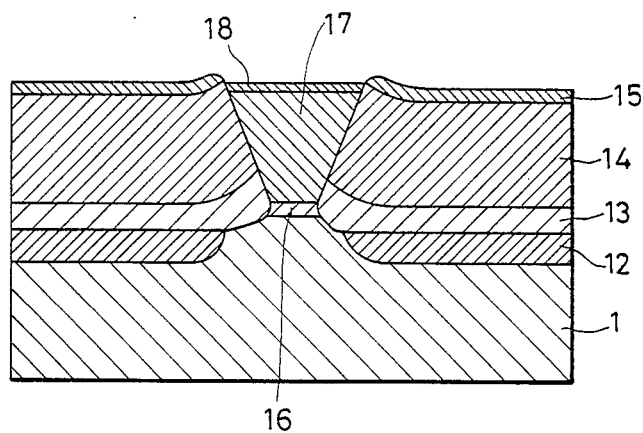
FIG. 3 is a sectional view of a semiconductor laser.

FIG. 3 is a sectional view showing an example of the laser structure to which the present invention is applied. In the drawing, reference numeral 1 represents an n-type InP substrate (carrier density: 0.5 ~3×10$^{18}$ cm$^{-3}$), and reference numeral 12 does a p-type layer formed by diffusion or ion implantation. Reference numeral 13 represents a p-type InP or InGaAsP layer formed by burying growth; 14 is an n-type InP layer formed likewise by burying growth; 15 is an n-type InGaAsP layer; 16 is an IRGaAsP active layer; 17 is a p-type InP cladding layer; and 18 is a p-type InGaAsP can layer. The laser having the structure shown in FIG. 3 can be obtained by the following method.

First of all, Zn or Cd is doped into the n-type InP substrate at the portions other than the portion which is to serve as a current path, thereby forming a p-type layer in the n-type substrate. Next, a multi-layer including the active layer is grown on this substrate. Thereafter, reverse mesa is formed by etching at the portion which is to serve as the current path, and p-type InP, n-type InP and n-type InGaAsP layers are continuously grown on both sides of the reverse mesa by etching. In the drawing, the p-type layer below the buried layers 13, 14 and 15 by the second growth is from 0.5 to 1.5 μm thick and the p-type InP layer 13 is from 0.5 to 1.5 μm thick.

According to this embodiment, the thickness of the p-type layer which serves as the current blocking layer can be easily increased. As a result, a breakdown voltage can be improved by 30% in comparison with the conventional structure not having the layer 12, and the laser operation becomes possible at a higher temperature and a higher output. The layer 12 in this embodiment is formed by doping Zn or Cd, but it may be formed by ion implantation of atoms of the Groups IIa and IIb. Though this embodiment uses the n-type substrate, the p-type InP substrate can also be used. In such a case, the conductivity type of each layer should be reversed and the layer 12 becomes the n-type. At this time, the n-type layer 12 can be obtained by the ion implantation of the atoms of the Group VIa, VIb or Si.

Embodiment 3

Figure 4:
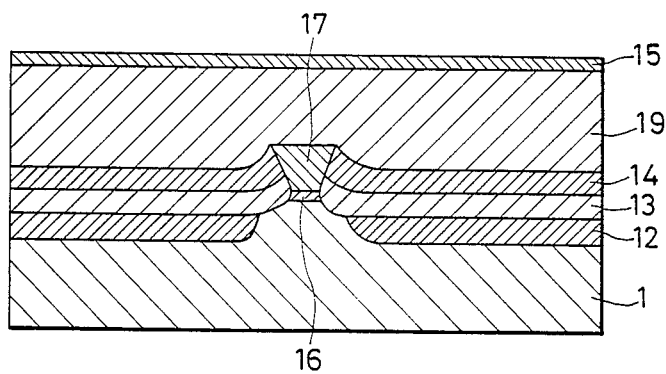
FIG. 4 is a sectional view of the laser.

FIG. 4 is a sectional view of an example of the laser structure to which the present invention is applied. In the drawing, the portions represented by reference numerals 1 through 17 are the same as those in the Embodiment 2. Reference numeral 19 represents a p-type InP buried layer. The p-type cladding layer 17 is thinner than that of the Embodiment 2 (2.5 to 3.5 μm) and is from 1 to 2 μm.

Basically, the production method of the laser having the construction shown in FIG. 4 of this embodiment is the same as in the Embodiment 2, but is different from the latter in that the p-type InP layer 19 is formed in such a manner as to cover the upper part of the mesa at the time of burying growth in succession to the p-type InP layer and the n-type InP layer, and thereafter the InGaAsP cap layer is grown continuously. According to this embodiment, width controllability of the p-type InP cladding layer 17 with respect to the active layer at the time of mesa formation is better than in the Embodiment 2. On the contrary, there has been a problem that the thickness of the p- and n-type InP current blocking layers 13 and 14 can not be increased. In accordance with the present invention, however, since the p-type layer 12 is disposed, the thickness of the p-type layer 13 can be sufficiently increased, and the terminal voltage can be increased by at least 50% in comparison with the prior art.

In this embodiment the mesa including the active layer has a reversed triangular mesa shape, but this can be formed in a normal mesa form. The method of forming the layer 12 is the same as that of the Embodiment 2 and can be formed by doping or ion implantation to the substrate. A p-type substrate may be used as the substrate in the same way as in the Embodiment 2.

Embodiment 4

Figure 5A:
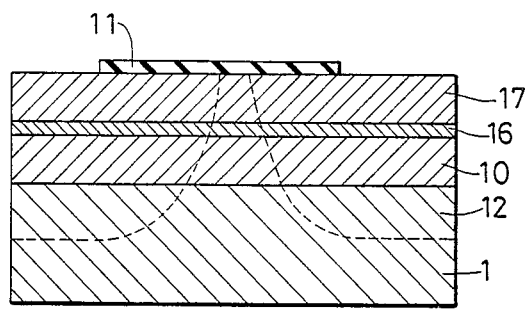
FIGS. 5A–5C are sectional views of the laser after during a diffusion process.

In the foregoing Embodiments 2 and 3, the p-type layer is formed in the n-type substrate before the growth. However, the p-type layer can be formed after the multi-layer including the active layer is grown by the method shown in FIGS. 5A-5C. An example of such a method is shown in this drawing. First of all, a multi-layer including the active layer 16 is grown as shown in FIG. 5a and an SiO$_2$ film or an Si$_3$N$_4$ film 11 is formed as a mask at the portion which is to serve as a current path. A p-type impurity is then doped using this mask, as represented by dotted line. Here, a layer 10 is an n-type InP buffer layer. The diffusion thickness is greater by 1 μm than the layer 16.

Figure 5B:
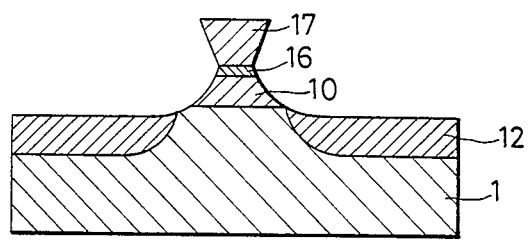
Figure 5C:
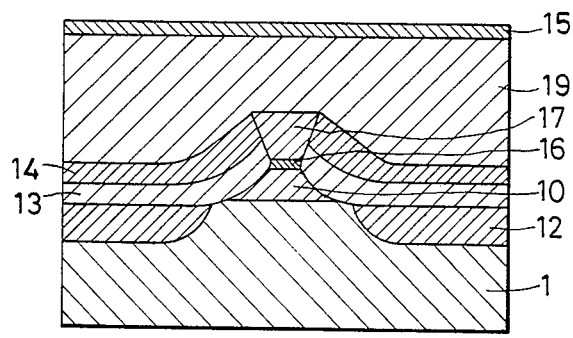

Then, a mesa is formed by etching as shown in FIG. 5b and subsequently p-type and n-type InP layers are formed on both sides of the mesa. Further subsequently, a p-type InP layer 19 and an InGaAsP layer 15 are grown. In accordance with the methods shown in the Embodiments 2 and 3, accurate alignment is necessary in order to bring the portion which is to serve as the current path and at which no p-type layer exists into conformity with the mesa position. In contrast, this embodiment facilitates alignment. In this embodiment, the mesa shape is a reversed triangular mesa shape, it may also be a normal mesa shape. As described in the Embodiments 2 and 3, the p-type may be used for the substrate and the method of forming the layer 12 may be ion implantation.

Embodiment 5

Another embodiment of the present invention, which is applied to a buried layer of a semiconductor laser, will be described with reference to FIG. 6.

Figure 6:
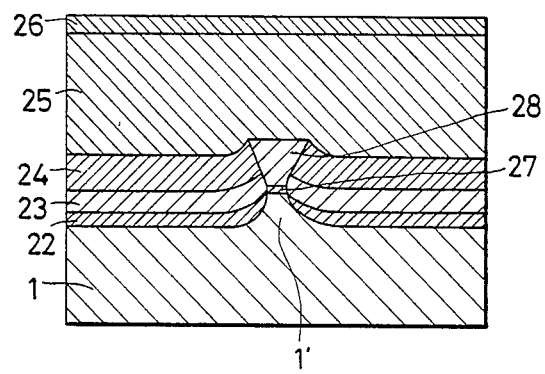
FIG. 6 is a sectional view of a buried hetero structure semiconductor laser of Embodiment 5 of the present invention.

FIG. 6 is a sectional view of a semiconductor laser formed on an n-type InP substrate. In this embodiment, an InGaAsP active layer and a p-type InP layer are grown on an n-type substrate by liquid phase epitaxy, and a mesa stripe is formed while leaving the active layer which is about 1 μm wide. Then, a p-type InGaAsP layer 22, a p-type InP layer 23 and an n-type InP layer 24 are formed on both sides of the mesa by liquid phase epitaxy, and a p-type InP layer and a p-type InGaAsP layer are grown subsequently on the entire surface, thereby providing the semiconductor laser of this embodiment. Here, the p-type InGaAsP layer 22 is from 0.1 to 0.5 μm thick at the flat portion, the p-type InP layer 23 is from 0.2 to 0.5 μm thick, the n-type InP layer 24 is from 0.3 to 0.6 μm thick, the p-type InP layer 25 is from 1.5 to 3 μm thick and the p-type InGaAsP layer 26 is from 0.2 to 0.4 μm thick.

Figure 7:
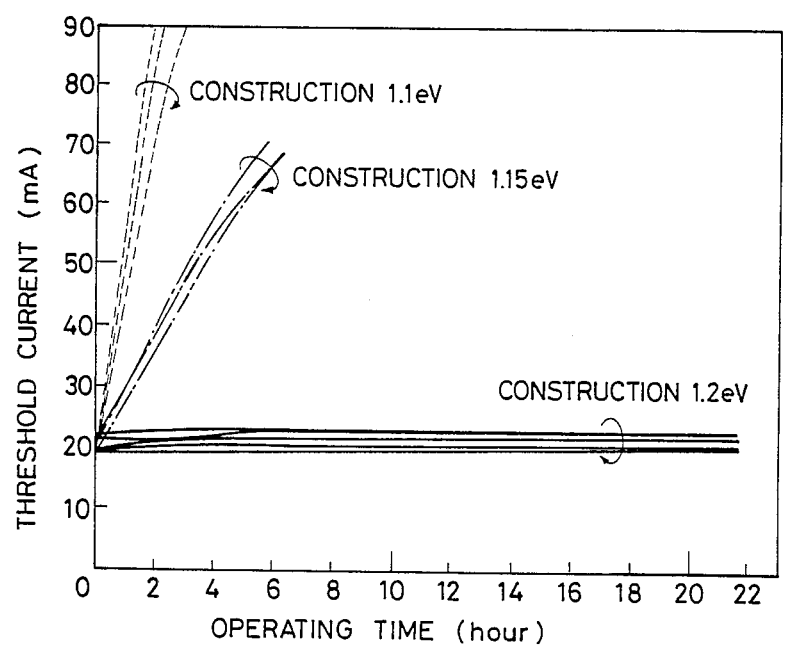
FIG. 7 is a diagram showing the change with time of a threshold current value when the laser of Embodiment 5 is operated.

In accordance with this embodiment, an n-p-n type structure is constituted by the layers 24, 23, 22 and the substrate 1, and the InGaAsP layer exists in the p-type layer of the intermediate layer. These layers function as the current blocking layers which inhibit the outflow of the current from the active layer. Since the InGaAsP layer is used at a part of the current blocking layers in the manner described above, the current can be blocked more stably. This is because the life of the minor carrier of the InGaAsP layer is shorter than InP when the InGaAsP layer is introduced into the intermediate layer (the p-type layer) as the base, and the current amplification ratio of the transistor becomes smaller. The present invention is characterized in that the energy band gap of this InGaAsP layer 22 is set to be at least 1.2 eV. FIG. 7 shows the result of reliability test of the semiconductor laser, which test is carried out by changing the composition of this InGaAsP layer 22.

FIG. 7 shows the change of a threshold current value with respect to an operation time at room temperature in forced acceleration degradation test (at 100° C. and 200 mA). As can be seen from this diagram, the devices having the InGaAsP layer 22 of energy band gaps of 1.15 eV and 1.1 eV, respectively, exhibits a drastic increase of the threshold current value within a short period. This results from the increase of a leakage current due to degradation of the buried layer. The degree of degradation is more remarkable in the case of 1.1 eV where the energy band gap is narrower. In the case of the deivce having the InGaAsP layer of 1.2 eV energy band gap, on the other hand, the increase of the threshold current value is not great and a stable operation can be obtained even after the passage of 20 hours. As described above, when the n-p-n type structure having the InGaAsP layer having an energy band gap of at least 1.2 eV in accordance with the present invention is used as the current blocking layer, there can be obtained a buried hetero structure semiconductor laser which has a smaller leakage current due to a transistor operation and exhibits a stable operation.

Though the InGaAsP layer 22 is used on the n-type InP substrate 1 in this embodiment, it may be disposed between the layers 23 and 24 or between the layers 24 and 25. Furthermore, it may be disposed at a plurality of positions. When the InGaAsP layer is used between the layers 23 and 24, it may be of the p-type or the n-type and when it is used between the layers 24 and 25, it is of the n-type. When the n-type is used, the InGaAsP layer exists in the n-type layer as the intermediate layer of the p-n-p structure constituted by the layers 23, 24 and 25.

Figure 8:
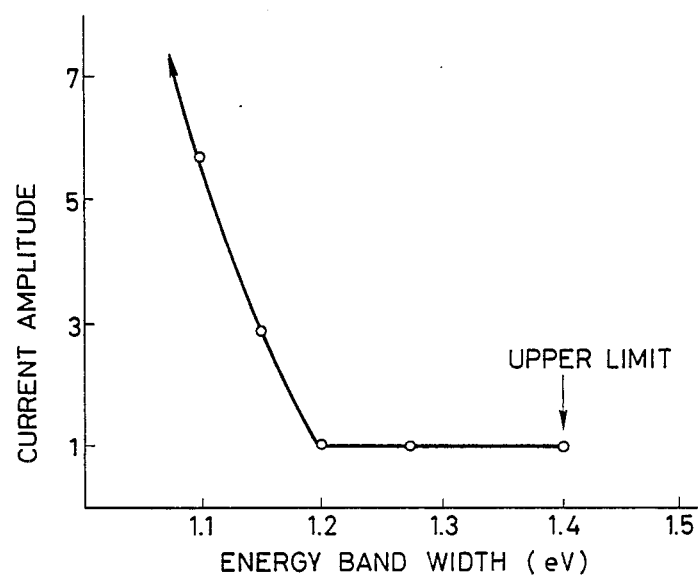
FIG. 8 is a diagram showing the relation between a current increase ratio and the energy band gap of InGaAsP.

FIG. 8 is a diagram showing the relation between a current increase ratio (the ratio of a current value after the passage of time to a current value at an intial stage) and the energy band gap of the quaternary buried layer when the energy band gap of the quaternary buried layer is changed and the laser is operated for 2 hours at 100° C. and 200 mA, whereby the current increase ratio represents how many times the threshold current value becomes the initial threshold current value. The greater the current increase ratio, the greater becomes degradation of the semiconductor laser, and when the current increase ratio is 1, it means that no degradation of the semiconductor laser occurs. As can be understood from FIGS. 8 and 7, degradation occurs when the energy band gap is below 1.2 eV, and the smaller the energy band gap, the greater becomes degradation of the laser. If the energy band gap is at least 1.2 eV in accordance with the present invention, on the other hand, degradation hardly occurs. Incidentally, it is not possible to form the InGaAsP layer whose energy band gap is at least 1.4 eV, and the current increase ratio remains 1 to this upper limit value 1.4 eV.

Embodiment 6

Figure 9:
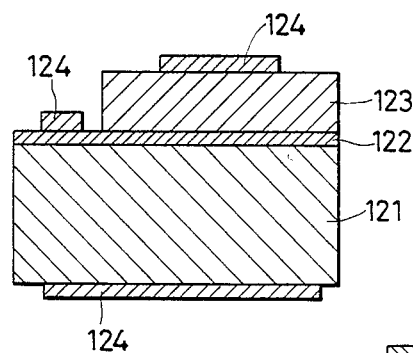
FIG. 9 is an explanatory view of Embodiment 6 of the present invention.

FIG. 9 shows an embodiment of n-p-n transistor using the present invention. A p-InGaAsP ($E_g \gtrsim 1.2$ eV) 122 as the base and an n-InP layer 123 are grown on an n-type InP substrate 121, and an electrode is disposed on each layer, thereby providing a hetero junction bipolar transistor. Here, the p-InGaAsP layer 122 as the base is from 0.1 to 0.3 μm thick and its composition has an energy band gap of at least 1.2 eV in accordance with the present invention. The transistor of this embodiment can be formed by use of the buried region of the semiconductor laser of the Embodiment 5 and can also be formed on the same substrate as that of the semiconductor laser. Since the energy band gap of the base is from 1.2 eV to 1.4 eV in this embodiment, a stable transistor operation can be obtained for a long period in the same way as the semiconductor laser of the Embodiment 5.

Besides the n-p-n transistor shown in FIG. 9, the present invention can be likewise applied to p-n-p transistors.

Embodiment 7

Figure 10:
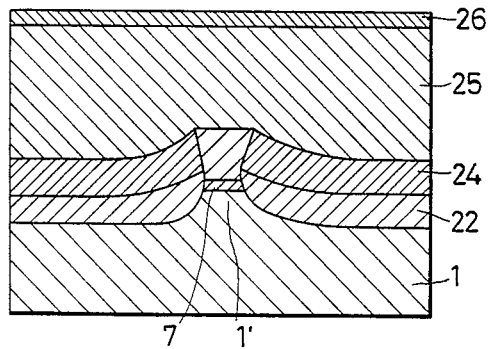
FIG. 10 is an explanatory view of Embodiment 7 of the present invention.

Still another embodiment of the invention will be described with reference to FIG. 10.

After an InGaAsP active layer and an n-type InP layer are formed by liquid phase epitaxy on a p-type InP substrate 1, a 1 μm-wide mesa stripe is formed.

Subsequently, a p-type InGaAsP layer 22 and an n-type InP layer 24 are grown on both sides of the mesa by liquid phase epitaxy, and a p-type InP layer is then formed on the entire surface. Here, the thickness of each layer is the same as that of each layer in the Embodiment 5.

In this embodiment, too, there can be obtained a semiconductor laser devoid of degradation with time, in the same way as in the Embodiment 5.

Embodiment 8

Besides the foregoing embodiments, a great number of embodiments are available on the basis of the gist of the present invention, and primary embodiments among them are tabulated in Table 1 together with their substrates and materials forming each semiconductor layer.

TABLE 1

| layer | 1 | 2 | 3 | 4 | 5 | 6 | 7 | 8 |
|---|---|---|---|---|---|---|---|---|
| 4th layer | P—InP | n-InP | — | — | — | P—GaAs | P—GaAs | P—GaAs |
| 3rd layer | n-InGaAsP | P—InP | P—InP | n-InP | n-InP | P—InGaAsP | P—InGaP | P—InAsP |
| 2nd layer | P—InGaAsP | n-InGaAsP | n-InGaAsP | P—InP | P—InGaAsP | n-InGaAsP | n-InGaAsP | n-InGaAsP |
| 1st layer | n-InGaAsP | P—InP | P—InGaAsP | n-InGaAsP | n-InP | P—InGaAsP | P—InGaP | P—InGaP |
| substrate | n-InP | n-InP | n-InP | P—InP | P—InP | n-GaAs | n-GaAs | n-GaAs |

| layer | 9 | 10 | 11 | 12 | 13 | Example 3 | Example 2 | Example 1 |
|---|---|---|---|---|---|---|---|---|
| 4th layer | n-GaAs | n-GaAs | n-InP | P—GaAs | n-GaAs | — | — | P—InP |
| 3rd layer | n-InAsP | n-InGaP | n-InGaP | n-InGaAsP | n-InGaAsP | P—InP | — | n-InP |
| 2nd layer | P—InGaAsP | P—InGaAsP | P—InGaAsP | P—InGaAsP | P—InGaAsP | n-InP | n-InP | P—InP |
| 1st layer | n-InAsP | n-InGaP | n-InGaAsP | n-InGaAsP | n-InGaAsP | P—InGaAsP | P—InGaAsP | P—InGaAsP |
| substrate | P—GaAs | P—GaAs | P—GaAs | n-InP | P—GaAs | n-InP | n-InP | n-InP |

Additionally, the terms "first layer, second layer, ..." in Table 1 represent the sequence of semiconductor layers to be laminated on the substrate and to form the junction. In the case of the embodiment shown in FIG. 6, for example, the first layer is the layer 2, the second layer is the layer 3, the third layer is the layer 4 and the fourth layer is the layer 5.

In the embodiment described above, the InGaAsP layer 2 is from 0.1 to 0.5 μm thick. Though the same effect can be obtained when the thickness is above 1 μm, a thinner layer is more advantageous from the aspect of easiness of growing the buried layer.

The present invention can be applied to semiconductor devices in general in addition to the embodiments described above.

What is claimed is:

1. In a buried hetero structure semiconductor laser, a mesa stripe having an active layer and side surfaces disposed at an acute angle to a semiconductor substrate to form a trapezoidal-like shape on the semiconductor substrate of multi-layered structure, said active layer is buried to cover the sides and top of said trapezoidal-like mesa shape and at least one p-n junction is disposed on both sides of said trapezoidal-like mesa stripe constituting a current blocking layer so that current flows only through said trapezoidal-like mesa stripe and at least one p-n junction interface is disposed between the narrowest part of said trapezoidal-like mesa shape and the upper end.

2. A semiconductor laser according to claim 1, wherein said trapezoidal-like mesa stripe is provided with a cladding layer which is from 0.5 to 3.0 μm thick on said active layer which includes a buffer layer.

3. A semiconductor laser according to claims 1 or 2, wherein said trapezoidal-like mesa stripe is formed by selectively etching a cladding layer consisting of InP by use of a selective etching solution for InP to form the mesa shape on said active layer, and then etching a portion below said active layer to form the trapezoidal-like mesa shape.

4. In a buried hetero structure semiconductor laser, an upper cladding layer formed on an active layer against a substrate constitutes a trapezoidal-like shaped mesa stripe structure, side surfaces of said upper cladding layer are buried by first buried layers comprising at least one p-n junction, respectively, constituting a current blocking layer so that current flows only through said stripe, at least one p-n junction is disposed between the bottom end of said active layer and the upper end of said upper cladding layer, and an upper surface of said upper cladding layer is buried by a second buried layer being of the same conductivity as said upper cladding layer.

5. A semiconductor laser according to claim 4, wherein the thickness of said upper cladding layer (d) is $0.5 < d \leq 3.0$ μm.

6. A semiconductor laser according to claim 5, wherein said thickness d is $1.0 \leq d \leq 3.0$ μm.

* * * * *